US007495930B2

(12) United States Patent
Caruba

(10) Patent No.: US 7,495,930 B2
(45) Date of Patent: Feb. 24, 2009

(54) CIRCUIT BOARD STRUCTURE FOR HIGH DENSITY PROCESSING OF ANALOG AND DIGITAL SIGNALS

(75) Inventor: James Frank Caruba, Bartlett, IL (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 493 days.

(21) Appl. No.: 11/474,598

(22) Filed: Jun. 26, 2006

(65) Prior Publication Data

US 2007/0297154 A1    Dec. 27, 2007

(51) Int. Cl.
*H05K 1/11* (2006.01)
(52) U.S. Cl. .................. 361/794; 361/780; 361/799; 361/777; 361/790; 361/818; 174/250; 174/260
(58) Field of Classification Search .................. 361/760, 361/778, 780, 794, 799, 800, 816, 818, 728, 361/736, 748, 777, 790; 174/261, 250, 260, 174/255; 341/144
See application file for complete search history.

(56) References Cited

U.S. PATENT DOCUMENTS 5,592,391 A * 1/1997 Muyshondt et al. .......... 716/15
5,671,220 A * 9/1997 Tonomura ................ 370/281
5,889,314 A * 3/1999 Hirabayashi ............. 257/508
6,121,827 A * 9/2000 Khoini-Poorfard et al. .. 327/565
2005/0092520 A1* 5/2005 Chao et al. ................. 174/260
2006/0012003 A1* 1/2006 Mallikarjunaswamy et al. .. 257/501
2007/0291459 A1* 12/2007 Hsu et al. ................. 361/794

* cited by examiner

*Primary Examiner*—Dean A. Reichard
*Assistant Examiner*—Hoa C Nguyen
(74) *Attorney, Agent, or Firm*—Peter L. Kendall

(57) ABSTRACT

A circuit board which has a high speed digital circuit in close proximity to a sensitive analog structure has a grounded, conductive band interposed between them and a ground plane with two separate, grounded portions, with a first of the portions underlying the digital circuit and a second portion underlying the analog structure. In an exemplary embodiment, the circuit board has a high density of analog-to-digital converter integrated circuits, each with two analog input signals and ten parallel high speed digital output signals corresponding to each input signal. A grounded, conductive band is placed on the board between the inputs and outputs of the integrated circuit, and a ground plane is provide which has separate, interleaved analog and digital areas, with the digital area underlying only portions of the board having digital signals and structures and the analog area underlying only portions of the board having analog signals and structures.

13 Claims, 4 Drawing Sheets

CIRCUIT BOARD STRUCTURE FOR HIGH DENSITY PROCESSING OF ANALOG AND DIGITAL SIGNALS

BACKGROUND OF THE INVENTION

The present invention relates generally to circuit board structures, and more particularly, concerns a circuit board structure capable of accommodating sensitive analog signals and high speed digital signals in close proximity, without interference therebetween.

For illustrative purposes, the present invention will be described in terms of a circuit board containing a high density of high speed analog-to-digital converters in a single photon emission computed tomography (SPECT) scanner for nuclear medicine applications.

There are several distinct types of imaging systems in contemporary nuclear medicine. One type may employ gamma scintillation cameras (GSCs), so-called "position sensitive" continuous-area detectors, or simply, nuclear detectors. An exemplary GSC is a single photon emission computed tomography (SPECT) scanner. Another type of imaging system involves computed tomography ("CT") of X-ray imaging. In contrast, magnetic resonance imaging (MRI) visualizes the inside of living organisms by making use of the relaxation properties of excited hydrogen nuclei in water placed in a powerful, uniform magnetic field.

Gamma rays are an energetic form of electromagnetic radiation produced by radioactive decay or other nuclear or subatomic processes such as electron-positron annihilation. Gamma rays form the highest-energy end of the electromagnetic spectrum. They are often defined to begin at an energy of 10 keV, a frequency of 2.42 EHz, or a wavelength of 124 pm, although electromagnetic radiation from around 10 keV to several hundred keV is also referred to as hard X-rays.

Gamma scintillation cameras, GSCs, are primarily used to measure gamma events produced by very low-level radioactive materials (called radionuclides or radio-pharmaceuticals) that have been ingested by, or injected into, a patient. The signals from the GSCs are used to generate images of the anatomy of organs, bones or tissues of the body and/or to determine whether an organ is functioning properly. The radiopharmaceuticals are specially formulated to collect temporarily in a certain part of the body to be studied, such as the patient's heart or brain. Once the radio-pharmaceuticals reach the intended organ, they emit gamma rays that are then detected and measured by the GSCs. Nuclear detectors perform spectroscopy and event X/Y positioning by processing signals from a constellation of Photo-multiplier Tubes (PMTs). An exemplary series of detectors comprises 59 PMTs.

To guard against the deleterious effects of stray X-rays blinding the scintillation crystal and the PMTs and possibly damaging the associated electronics, a GSC has a lead enclosure, i.e., tub, to block the stray X-rays. Furthermore, because the scintillation crystal emits faint amounts of light upon scintillation, the interior of the GSC must be shielded from ambient light that would blind the photosensors in the GSC used to measure the scintillation light emissions. The shielding guards against both gamma and X-rays.

Owing to the large number of interconnections between PMT preamplifiers and an acquisition electronics system, portions of the acquisition electronics system have typically been packaged inside the tub. It would be particularly desirable to perform analog-to-digital conversion, within the tub, of all the analog signals produced by the PMTs. This would permit a fully digital acquisition electronics implementation outside the tub, with all the attendant advantages. Space limitations have necessitated the use of a single board to perform the analog-to-digital conversion for all 59 PMTs. The board has sixty analog-to-digital converters, each with ten parallel digital outputs running at 30 MHz. With this dense packaging, such high digital speed signals tend to introduce digital noise to the sensitive analog circuits.

SUMMARY OF THE INVENTION

In accordance with the present invention, a circuit board which has a high speed digital circuit in close proximity to a sensitive analog structure has a grounded, conductive band interposed between them and a ground plane with two separate, grounded portions, with a first of the portions underlying the digital circuit and a second portion underlying the analog structure. In an exemplary embodiment, the circuit board has a high density of analog-to-digital converter integrated circuits, each with two analog input signals and ten parallel high speed digital output signals corresponding to each input signal. A grounded, conductive band is placed on the board between the inputs and outputs of the integrated circuit, and a ground plane is provided which has separate, interleaved analog and digital areas, with the digital area underlying only portions of the board having digital signals and structures, and the analog area underlying only portions of the board having analog signals and structures.

BRIEF DESCRIPTION OF THE DRAWINGS

The foregoing brief description and further objects, features, and advantages of the present invention will be understood more completely from the following detailed description of an exemplary embodiment with reference being had to the accompanying drawings in which.

DETAILED DESCRIPTION OF AN EXEMPLARY EMBODIMENT

An exemplary embodiment of the invention operates in an environment with a plurality of photo-multiplier tubes inside of a tub enclosure of a nuclear detector, which is to be electrically connected to an acquisition electronics system outside of the tub enclosure and contemplates penetrating the tub enclosure with the interconnection circuitry to provide the connection.

Figure 1:
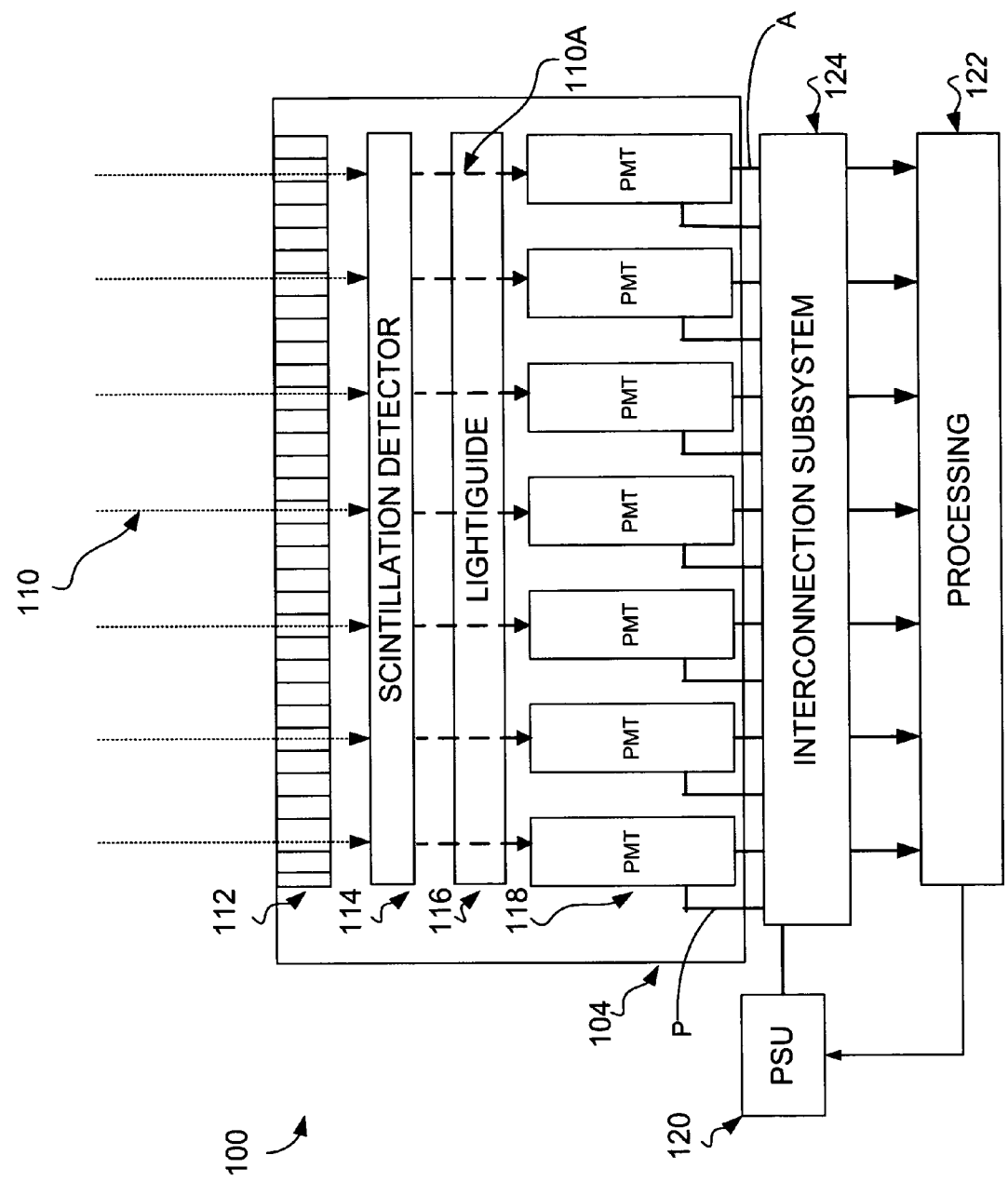
FIG. 1 is a block diagram of the Gamma ray detection circuitry of a SPECT scanner of a type in which the present invention would be utilized.

FIG. 1 is a block diagram depicting a gamma ray detection circuit of the SPECT scanner 100. Portions of the gamma ray detection circuitry are similar to those of Anger, U.S. Pat. No. 3,011,057, the entire disclosure of which is incorporated herein by reference. In particular, the gamma ray detection circuit includes a parallel hole collimator 112, a scintillation detector (crystal) 114, a light guide 116, a plurality of photo multiplier tubes (PMTs) 118, a power supply unit (PSU) 120 for the PMTs 118, and an acquisition electronics system 122 for processing the data from the PMTs 118. Interconnection circuitry 124 is used to connect the PMTs 118 to the power supply 120 and the acquisition electronics system 122.

The parallel hole collimator 112 acts as a guide to channel the gamma rays 110 through the tub 104 to the scintillation crystal 114. The scintillation crystal 114 functions as a gamma ray detector by-converting the-high-energy photons of the gamma rays 110 into visible light (i.e., lower energy photons). When a gamma ray 110 strikes and is absorbed in the scintillation crystal 114, the energy of the gamma ray 110 is converted into flashes of light 110A (i.e., a large number of scintillation photons) that emanate and spread from the point at which the gamma ray 110 is absorbed. The scintillation crystal 114 may be formed from any suitable materials known in the art, such as sodium iodide doped with a trace of thallium (NaI(T1)) or CsI(T1). The scintillation photons 110A emitted from the scintillation crystal 114 are typically in the visible light region of the electromagnetic spectrum (and may have a mean value of about 3 eV for NaI(T1)).

The light guide 116 assists in focusing the scintillation photons 110A from the scintillation crystal 114 to the PMTs 118. The plurality of PMTs 118 is located adjacent to the light guide 116. In one or more embodiments, the number of PMTs may be on the order of about 50 to 100 tubes arranged in a two dimensional array. The basic function of the PMTs 118 is to detect and amplify the scintillation photons 110A (events).

Each PMT 118 is operable to detect a fraction of the scintillation photons 110A emanating from the scintillation crystal 114 and produce an analog output signal (e.g., a current or voltage pulse) having an amplitude that is proportional to the number of detected scintillation photons 110A. Each PMT 118 includes a light sensitive surface, called the photocathode, which emits electrons in proportion to the number of incident scintillation photons 110A. The emitted electrons, also called photoelectrons, are then electro-statically accelerated into an electron multiplying structure of the PMT 118, which causes an electrical current (or voltage) to be developed at an output of the PMT 118.

The amplitude of the output signal is proportional to the number of photoelectrons generated in the PMT 118 during the time period that scintillation photons 110A are incident. More specifically, the amplitude of the output signal from each PMT 118 is proportional to two basic factors: (i) the number of scintillation photons 110A detected by the PMT 118, and (ii) the gain of the electron multiplying structure of the PMT 118. Thus, after a gamma ray 110 absorption event at the scintillation crystal 114, a given PMT 118 outputs a signal that can be used (with other signals from other PMTs 118) to determine the location of the gamma ray 110 absorption event.

Assuming that the analog output signals from the PMTs 118 are current signals, such output signals are subject to a current-to-voltage conversion-to-yield an analog voltage signal. The analog voltage signals are then digitalized using analog to digital ("A/D") converters prior to the acquisition electronics system 122 (in the tub), so that the acquisition electronics may be entirely digital. The interconnection circuitry 124 communicates the signals from the A/D converters to the acquisition electronics system 122.

A basic function of the acquisition electronics system 122 is to calculate the spatial location and energy level of the incident gamma rays 110 based on the digitized analog output signals from the PMTs 118. From such location information, the acquisition electronics system 122 is then operable to produce a two dimensional image of the anatomy of a patient, which may be displayed on a CRT or other display mechanism. The number of scintillation photons producing output in each PMT 118 is inversely related to the distance of the PMT 118 from the point of gamma ray absorption, or event location, within the scintillation crystal 114. Thus, the acquisition electronics system 122 uses this relationship to compute the position of the gamma event from the output signals of a number of the PMTs 118 surrounding the event location.

Further details regarding the basic operation and structure of the gamma ray detection circuitry of the SPECT scanner 100 may be found in U.S. Patent Application Publication No. US2004/0036026 and/or U.S. Pat. No. 6,124,595, the entire disclosures of which are incorporated herein by reference.

Figure 2:
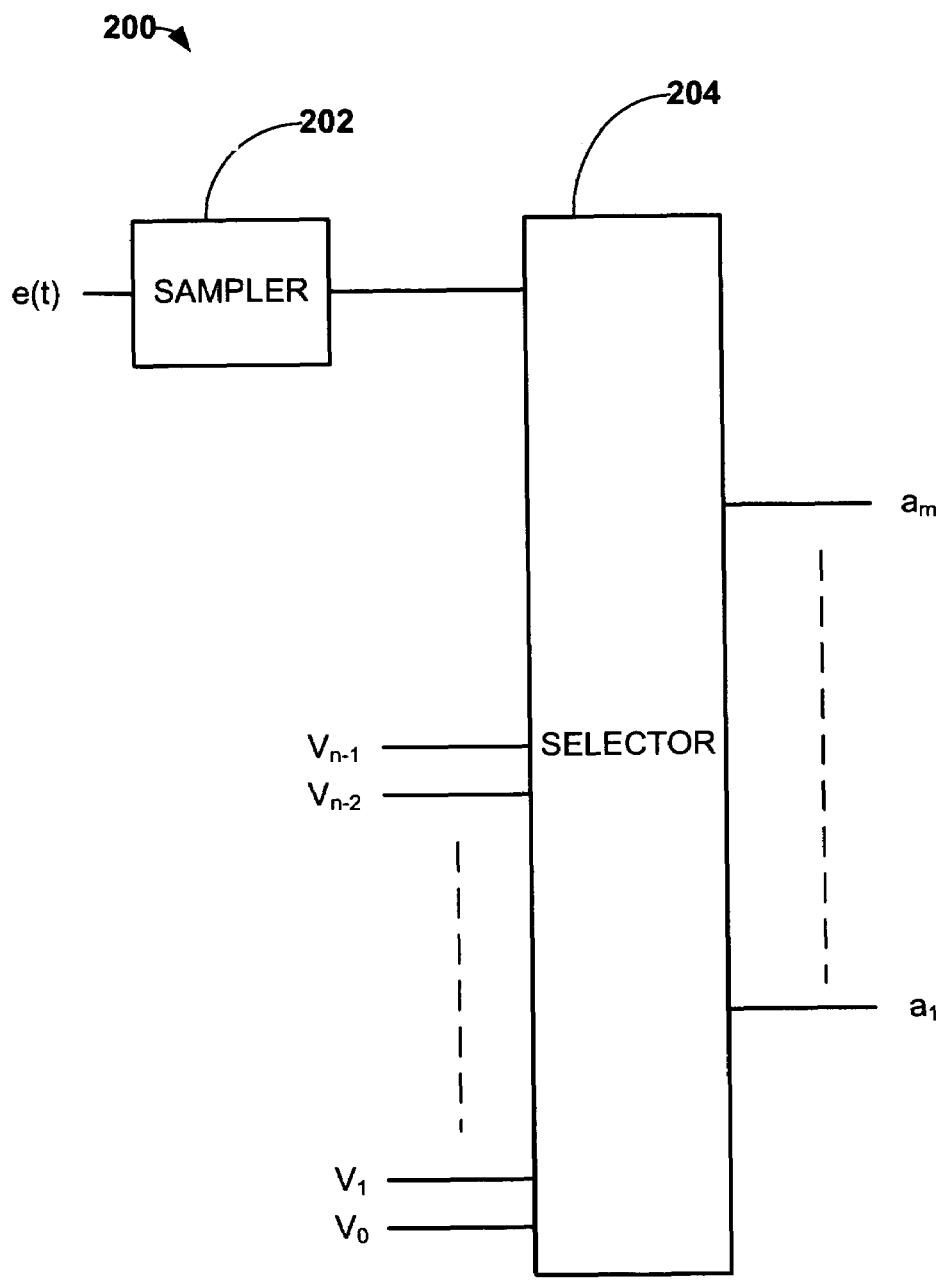
FIG. 2 is a functional block diagram of an analog-to-digital converter.

FIG. 2 is a functional block diagram of an A/D converter 200. Converter 200 receives a time variable voltage signal e(t) and outputs a sequence of binary words, each made up of M bits $a_1, \ldots, a_m$ in a series of sample times. These signal e(t) is applied to a sampler 202, which produces a series of amplitude samples. According to information theory, all relevant information in the signal e(t) will be retained in the series of samples if e(t) is sampled at a frequency equal to or greater than twice the highest frequency of interest in e(t). The samples are applied to a selector 204 which also receives m reference voltages $V_0 \ldots, V_{m-1}$. Selector 204 compares each sample to the reference voltages, selecting that reference voltage which is closest in amplitude to the sample. Each referenced voltages associated with a unique combination of the bits $a_1, \ldots, a_m$, and selector 204 outputs that combination of bits which corresponds to the selected reference voltage. For example, selector 204 might output 10 bits in parallel (m=10). With 10 bits, there are $2^m$ (1,024) possible combinations. There would therefore be 1,024 referenced voltages (m=1,024), and each sample may be resolved to one of 1,024 levels. As a further example, the digital word output by selector 204 could correspond to the subscript of the referenced voltage. Thus, if the $V_0$ is selected, the bits $a_1, \ldots, a_m$ would all be logical 0, whereas if the voltage $V_{m-1}$ were selected, the bits $a_1, \ldots, a_m$ would all be logical 1s. Thus, selector 204 outputs a sequence of binary words representing the sequence of sampled amplitudes of e(t).

Figure 3:
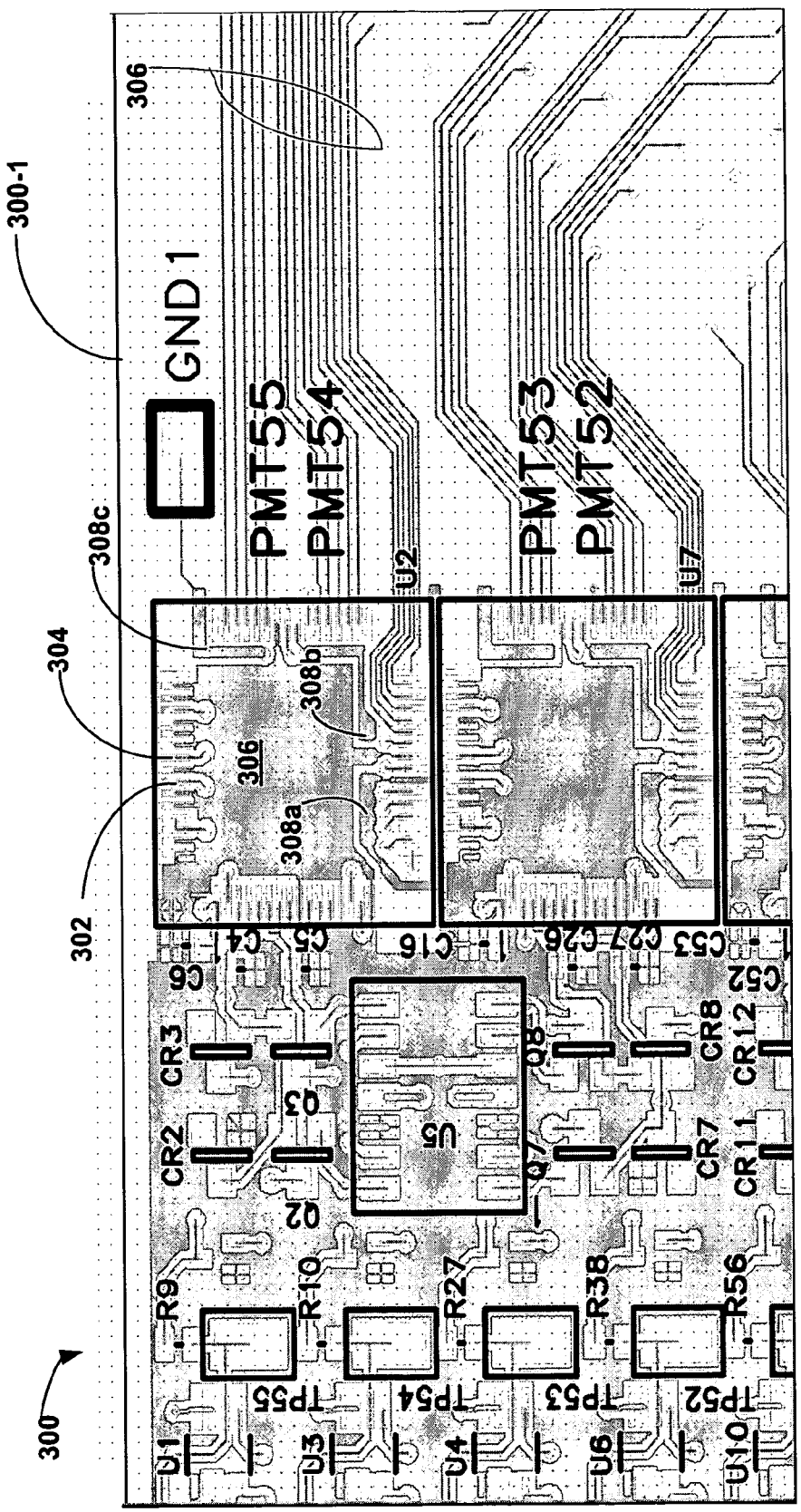
FIG. 3 is a diagram of a portion of a circuit board with multiple analog-to-digital converters on it embodying the present invention, there being shown the first layer of the circuit board.

In an exemplary embodiment, all of the A/D converters are provided on a single circuit board 300. That circuit board has 12 layers. FIG. 3 is a view of the upper portion of the first layer 300-1. For convenience of description, the circuit components are not present. Integrated circuit U2 is a dual A/D converter, and in this embodiment, accommodates PMTs 54 and 55. As a whole, the board 300 contains 30 of these, having the ability to accommodate 60 PMTs. For convenience of description, only U2 will be discussed in detail, it being understood that the remaining integrated circuits are identical.

The analog inputs to circuit U2 are applied at terminals 302, 304 at the top of the circuit, and the corresponding digital signals are produced at the right and bottom of the circuit. Leads 306 include the 10 bits, coming out of the side of circuit U2 and five of the bits coming out of the bottom. The additional five bits at the bottom of circuit U2 are extracted on another level and not shown. In addition, inputs are provided at the left side of circuit U2 which include various operating voltages and the reference voltages for the A/D conversion. The circuitry to the left of circuit U2 is involved in generating those reference voltages and includes precision circuitry which drives a voltage divider for producing the reference voltages from a precise power supply voltage of 2.7 volts. Since there are 1,024 referenced levels, adjacent reference voltages (corresponding to the least significant bit) are 2.65 millivolts apart. DC offset corrections are made to a resolution of 1/32 of this step size or 83 microvolts. Since the digital signals on leads 306 run at 30 megahertz, it will be appreciated that there are substantial high frequency components in those signals. If any significant amount of radiation of those components is permitted, they could easily corrupt the analog inputs at 302, 304, flash-amplifiers and ladder reference amplifiers which produce the precise reference voltages.

To deal with the problem of such high frequency interference, a grounded conductive plane 306 is positioned under circuit U2. This plane provides some shielding for the analog connections along the top and left of circuit U2, in particular, the connections 302 and 304. In addition, conductive bands 308a, 308b and 308c are separated from area 306 and grounded separately. These conductive bands serve as a guard between the digital outputs and analog structures.

Figure 4:
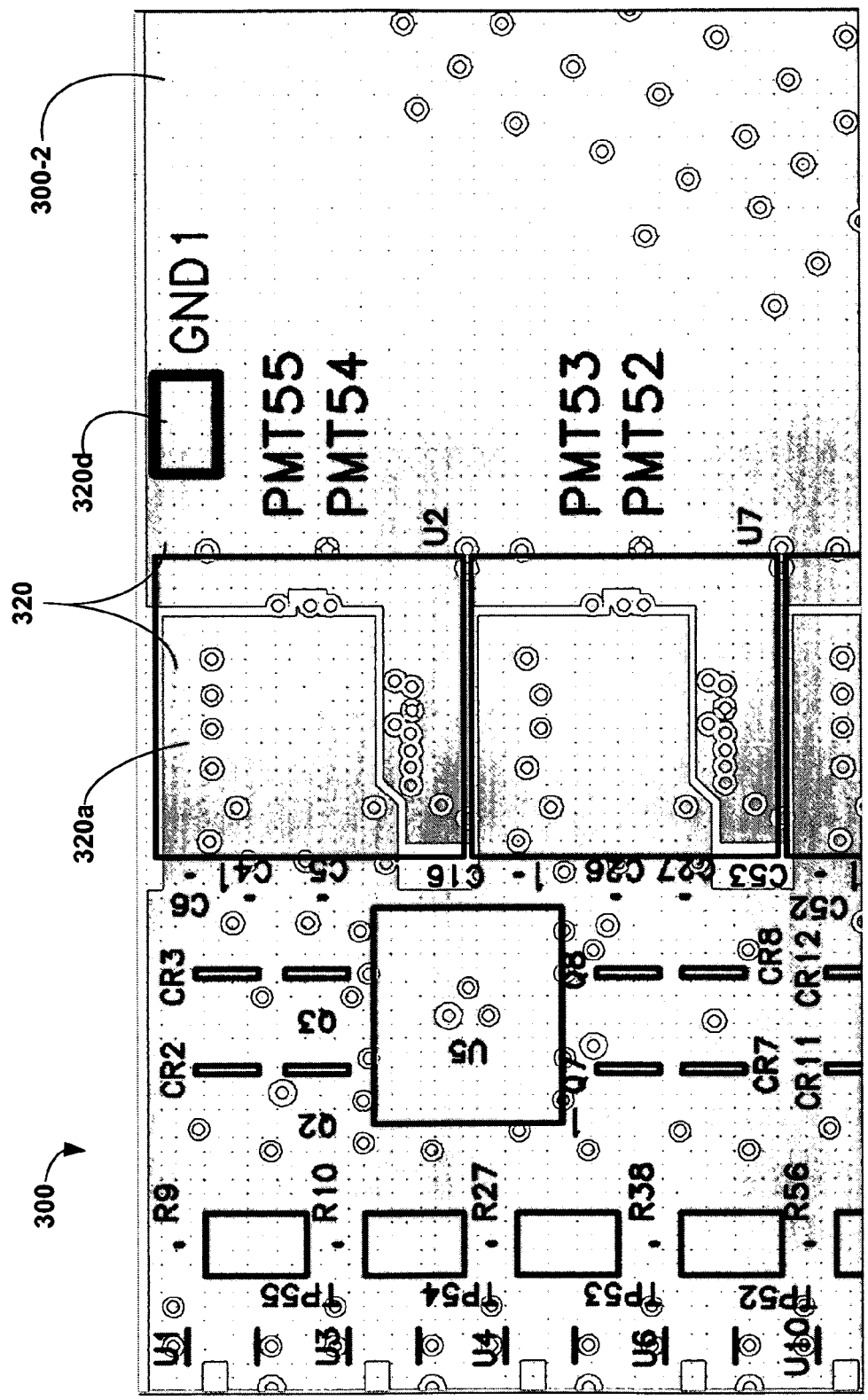
FIG. 4 is a diagram similar to FIG. 3 illustrating a second layer of the circuit board embodying the present invention.

FIG. 4 is a diagram, similar to FIG. 3, illustrating the layout of the second layer 300-2 of board 300 although the various circuits have been outlined on this layer, it will be appreciated that it is essentially a ground plane. In particular, the ground plane is divided into two separate sections 320a, 320d such that section 320a underlies the analog circuitry and section 320d underlies the digital circuitry and conductors, with the two component ground planes being separately grounded. In particular, it should be noted that the analog and digital ground planes (320a, 320d) are constructed so that the analog ground plane underlies the analog structures and connectors, and the grounded area 306, while the digital ground plane 320d underlies the guard bands 308a, 308b and 308c, as well as all of the digital structures and conductors.

In a circuit board with these many layers, there may be other layers with grounded portions corresponding to and aligned with the analog ground plane 320a and/or the digital ground plane 320d. The overall principle remains, however, that a portion of a ground plane is constructed to underlie the analog circuits and the portion is constructed to underlie the digital circuits. With the separate analog and digital ground planes and the guard bands surrounding digital outputs, any substantial amount of digital noise prevented from being introduced in the analog circuitry.

Although an exemplary embodiment of the invention has been disclosed for illustrative purposes, those skilled in the art will appreciate that many additions, modifications and substitutions are possible without departing from the scope and spirit of the invention as defined by the accompanying claims.

What is claimed:

1. In a circuit board which, when populated, has a high speed digital signal of a digital structure in close proximity to a sensitive analog structure, comprising a grounded, conductive band on the board interposed between the digital and analog structures, and a ground plane structure with two separate, grounded areas, with a first of the areas underlying the location of the digital structure and a second of the areas underlying the location of the analog structure;

the circuit board further comprising, when populated, an additional high speed digital signal of an additional digital structure and an additional analog structure, the first area underlying the locations of both digital structures and the second area underlying the locations of both analog structures; and wherein the first and second areas are interleaved.

2. The circuit board of claim 1 wherein, when populated, one of the digital structures is a first terminal of an integrated circuit, the digital structure producing a high speed digital signal in use, and one of the analog structures is a second terminal of the integrated circuit which receives an analog signal in use, the first and second areas both underlying a portion of the location of the integrated circuit.

3. The circuit board of claim 2 wherein, when populated, the additional digital structure is a third terminal of the integrated circuit which produces a high speed digital signal, and the additional analog structure is a fourth terminal of the integrated circuit which receives an analog signal, the first area underlying the locations of both digital structures and the second area underlying the locations both analog structures.

4. The circuit board of claim 3 further comprising an integrated circuit which contains an analog-to-digital converter, one of the first and third terminals being one of a plurality of parallel digital outputs of the analog-to-digital converter and one of the second and fourth terminals being an analog input to the analog-to-digital converter.

5. The circuit board of claim 2, further comprising, when populated, an additional digital structure which is a first terminal of an additional integrated circuit that produces a high speed digital signal, and an additional analog structure which is a second terminal of the additional integrated circuit which receives an analog signal, the first area underlying the locations of both digital structures and the second area underlying the locations of both analog structures.

6. The circuit board of claim 5 further comprising an additional integrated circuit containing an analog-to-digital converter, one of the first terminal being one of a plurality of parallel digital outputs of an analog-to-digital converter one of the second terminal being an analog input to an analog-to-digital converter.

7. The circuit board of claim 6 wherein the analog input is an analog signal which is being converted by the to the parallel digital outputs of an analog-to-digital converter.

8. The circuit board of claim 1 wherein, when populated, the digital structure is a first terminal of an integrated circuit, the digital structure producing a high speed digital signal in use, and the analog structure is a second terminal of the integrated circuit which receives an analog signal in use, the first and second areas both underlying the location of a portion of the integrated circuit.

9. The circuit board of claim 8 further comprising an integrated circuit which contains an analog-to-digital converter, one of the first and third terminals being one of a plurality of parallel digital outputs of the analog-to-digital converter and one of the second and fourth terminal being an analog input to the analog-to-digital converter.

10. The circuit board of claim 9 wherein the one of the second and fourth terminals contains analog signal which is being converted to the parallel digital outputs of the analog-to-digital converter which include the digital signal of the one of the first and third terminal.

11. The circuit board of claim 1, further comprising, when populated, an additional digital structure which is a first terminal of an additional integrated circuit that produces a high speed digital signal, and an additional analog structure which is a second terminal of the additional integrated circuit which receives an analog signal, the first area underlying the locations of both digital structures and the second area underlying both analog structures.

12. The circuit board of claim 11 further comprising an additional integrated circuit containing an analog-to-digital converter, a first terminal thereof being one of a plurality of parallel digital outputs of the analog-to-digital converter and a second terminal thereof being an analog input to the analog-to-digital converter of the additional integrated circuit.

13. The circuit board of claim 12 wherein one of the analog inputs is an analog signal which is being converted to the parallel digital outputs of the respective analog-to-digital converter.

* * * * *